United States Patent [19]

Shinohara et al.

[11] Patent Number: 5,682,048
[45] Date of Patent: Oct. 28, 1997

[54] GROOVE-TYPE SEMICONDUCTOR DEVICE

[75] Inventors: Toshiro Shinohara, Yokosuka; Masakatsu Hoshi, Yokohama; Teruyoshi Mihara, Yokosuka, all of Japan

[73] Assignee: Nissan Motor Co., Ltd., Yokohama, Japan

[21] Appl. No.: 648,965

[22] Filed: May 17, 1996

[30] Foreign Application Priority Data

May 19, 1995 [JP] Japan ............... 7-121656

[51] Int. Cl.⁶ ............... H01L 29/76; H01L 29/94; H01L 31/062; H01L 31/113
[52] U.S. Cl. ............... 257/342; 257/331; 257/341
[58] Field of Search ............... 257/342, 331

[56] References Cited

U.S. PATENT DOCUMENTS

| | | | |
|---|---|---|---|
| 3,975,221 | 8/1976 | Rodgers | 257/330 |
| 4,438,448 | 3/1984 | Harrington et al. | 257/331 |
| 5,034,785 | 7/1991 | Blanchard | 257/330 |
| 5,192,989 | 3/1993 | Matsushita et al. | 257/342 |
| 5,283,454 | 2/1994 | Cambou | 257/328 |
| 5,352,915 | 10/1994 | Hutchings et al. | 257/361 |
| 5,378,914 | 1/1995 | Ohzu et al. | 257/369 |

FOREIGN PATENT DOCUMENTS

| | | |
|---|---|---|
| 55-48972 | 4/1980 | Japan . |
| 63-173371 | 7/1988 | Japan . |
| 3-167879 | 7/1991 | Japan . |
| 4-165678 | 6/1992 | Japan . |
| 6-151867 | 5/1994 | Japan . |

Primary Examiner—Ngân V. Ngô
Assistant Examiner—Allan R. Wilson
Attorney, Agent, or Firm—Foley & Lardner

[57] ABSTRACT

A semiconductor structure having a plurality of drivers in and on the same semiconductor substrate is arranged to increase the density of integrated components and reduce the on resistance. The semiconductor structure employs a double layer interconnection structure having source and drain electrodes at two different levels, and an insulated gate electrode in a groove formed the semiconductor substrate. Each drain lead region having a low resistivity material extends from the upper surface of the substrate to a low resistivity buried layer. Each drain opening is surrounded by a source zone formed with a series of source holes or a long and narrow source slot, and this basic pattern is regularly repeated in a plane.

28 Claims, 18 Drawing Sheets

GROOVE-TYPE SEMICONDUCTOR DEVICE

BACKGROUND OF THE INVENTION

The present invention relates to a power semiconductor device (UMOS) having a U groove of a U-shaped sectional shape and a structure to reduce the on resistance. The UMOS is a power MOSFET in which a gate electrode has a U-shaped cross sectional shape and a channel is formed along the side surface of the gate electrode.

FIGS. 19A and 19B show a first conventional example disclosed in a Japanese Patent Provisional Publication No. 6-151867. In this conventional example, current flows from a backside drain electrode 1 to a topside source electrode 2, as shown in FIG. 19B, so that there is no need for providing a drain lead region on the upper side of the substrate. Therefore, source regions 4 can be distributed very densely as shown in FIG. 19A, and the dense source pattern can reduce the on resistance. In this structure, however, it is not possible to form a plurality of drivers in the same substrate because the entirety of the substrate is used as a drain region. As shown in FIG. 19B, there is further provided a topside gate electrode 3.

FIG. 20 shows a second conventional example disclosed in a Japanese Patent Provisional Publication 63-173371. In the structure shown in FIG. 20, an $N^+$ buried layer 13 is formed on a P type substrate 12, and buried under an $N^-$-type withstand layer 14. An $N^+$ drain lead region 19 extends deep from the topside semiconductor surface to the $N^+$ buried layer 13, and thereby connects a topside drain electrode 11 with the buried layer 13. Polysilicon is filled through an oxide film in a U groove which extends downward from the topside semiconductor surface through an $N^+$ source region 17 formed in a P channel region, and reaches the withstand layer 14. A topside source electrode 26 is connected with the source region 17, and a topside gate electrode 25 is connected with the polysilicon region 24 in the U groove. In this structure, the withstand region 14 is separated from other withstand regions by junction isolation, and each isolated withstand region can be used for one driver. Therefore, the buried layer 13, the drain lead region 19 and the drain electrode 11 can be formed independently, so that a plurality of drivers can be readily formed in and on the same substrate. This example is silent about the lateral geometry of the drain and source regions.

FIGS. 21A and 21B show a third conventional example disclosed in a Japanese Patent Provisional Publication No. 3-167879. The semiconductor structure of the third conventional example is a so-called lateral DMOS structure, not the UMOS structure to which the present invention pertains. In the lateral DMOS structure, gate electrodes 39 and 40 insulated by an insulating layer 41 are formed above the surface of a semiconductor substrate, and base and source regions are formed by double diffusion. It is possible to apply this conventional example to the UMOS structure of the present invention. This example shown in FIG. 21B employs a pattern or regularly arranged two-dimensional unit cells each having one drain contact (or drain takeout) $N^+$ region 38 and two adjacent source (or source takeout) $N^+$ regions 36 so that the ratio of the number of drain cells to the number of source cells is 1:2. A drain region 34 is connected through the drain contact region 38 to a drain electrode having a lower level interconnecting portion 43 and a higher level interconnecting portion 45. A source electrode 42 formed by a lower interconnecting layer is connected with the source region 36 and a channel region 35. The third conventional example employs the multilevel metallization (or interconnection) structure of the source and drain electrodes 42 and 45 separated by an insulating layer 44. With the multilevel structure facilitating the cell arrangement of the source openings and drain openings, and with the hexagonal pattern enabling a dense integration of components, the third conventional example can reduce the on resistance. In the third conventional example, however, the ratio between the number of source cells and the number of drain cells is 2:1. Therefore, the reduction of the channel resistance is difficult, the reduction of the on resistance is limited, and the improvement of the switching characteristic is difficult.

SUMMARY OF THE INVENTION

It is therefore an objective of the present invention to provide a semiconductor device which can improve the operating speed and reliability of the device by enabling higher integration, reduction of on resistance and improvement of switching characteristic.

According to the present invention, there are provided a low resistivity region, such as a heavily doped (buried) layer or a (buried) layer of low resistivity silicide, formed under a drain region; a deep drain lead region, such as a heavily doped region or a trench filled with a low resistivity material, reaching the low resistivity region; a double-layer interconnection structure of drain and source electrodes; and a pattern of drain openings each surrounded by one or more source openings each of which is surrounded by a U-shaped gate portion.

DETAILED DESCRIPTION OF THE INVENTION

Figure 1A:
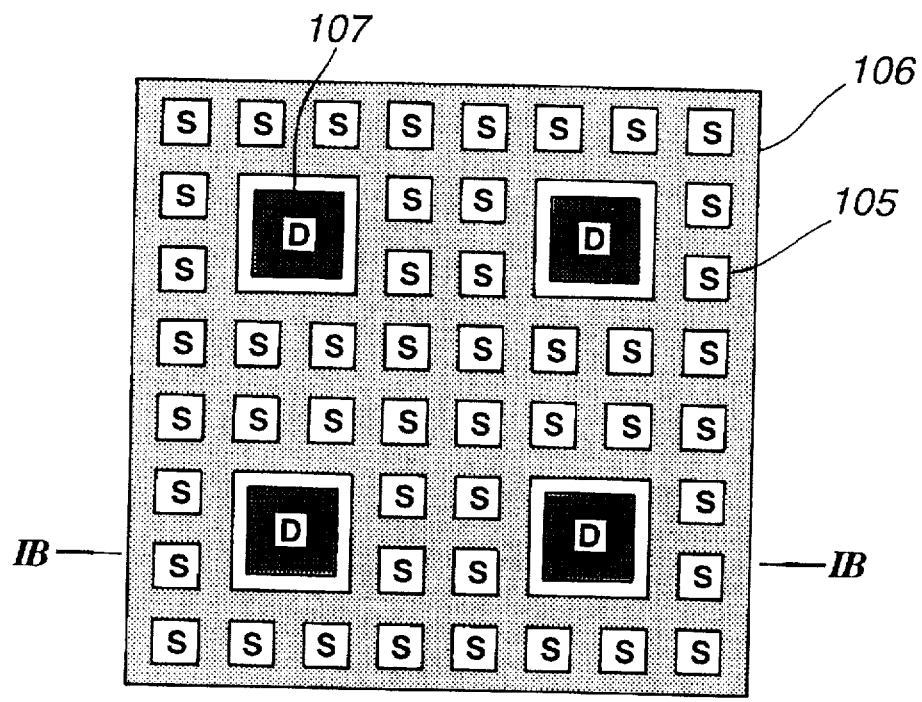
FIG. 1A is a plan view showing a planar electrode pattern of a semiconductor device according to a first embodiment of the present invention.
Figure 1B:
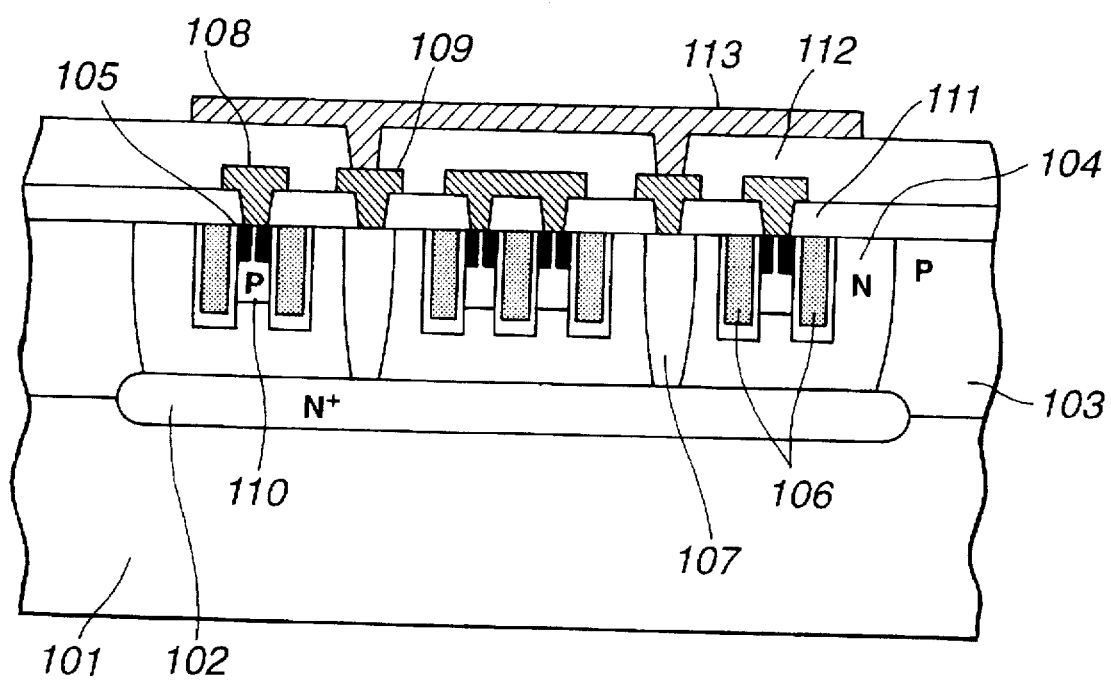
FIG. 1B is a sectional view of the semiconductor device taken across a line IB—IB of FIG. 1A.

A first embodiment of the present invention is shown in FIGS. 1A and 1B.

A semiconductor device according to the first embodiment, as shown in FIG. 1B, has a P type semiconductor substrate 101, an $N^+$ type buried layer 102 formed in a first major surface of the semiconductor substrate 101, and an P type epitaxial layer 103 grown on the first major surface of the substrate 101.

The semiconductor device shown in FIG. 1B further comprises an N well region 104 formed in the P type epitaxial layer 103, at least one P type base region 110 formed in the N well region 104, and at least one drain lead region 107 formed in the N well region 104. A highly doped $N^+$ type source region 105 is formed in the P base region 110. There is further formed at least one U-shaped gate portion 106 which has one side touching the adjacent P base region 110 and highly doped $N^+$ source region 105.

In this example, the $N^+$ buried layer 102 serves as a low resistivity region formed under the N well region 104 serving as a drain region.

A source electrode 108 and a drain electrode 109 are insulated from the U gate portion 106 by a first interlayer insulating film 111. A second level drain electrode 113 is insulated from the source electrode 108 by a second interlayer insulating film 112.

In this semiconductor device, source cells and drain cells are arranged as shown in FIG. 1A. In the lateral geometry shown FIG. 1A, each drain cell is surrounded by twelve of the source cells, and a unit of twelve source cells surrounding one drain cell is repeated regularly in a plane parallel to the upper semiconductor surface. When, in the state in which a positive voltage is applied between the second level drain electrode 113 and the source electrode 108, a voltage equal to or higher than a threshold voltage is applied to the U-shaped gate portion 106, then the surface of the p base region 110 at the side of the gate portion 106 is inverted to form a channel. As a result, current flows vertically through the drain lead region 107, then flows laterally through the $N^+$ buried layer 102, further flows vertically through the N well region 104, and flows into the $N^+$ source region 105 through the above-mentioned channel.

In the example shown in FIG. 1A, each unit has a 4×4 matrix of the source cells in which a central 2×2 matrix is used as a drain cell area, and the surrounding of the drain cell is partly used as a source cell area. The buried layer 102 and the drain electrode 109 are connected together by the drain lead region 107 which is formed by diffusion and which are low in electric resistance. The drain lead region 107 requires deep diffusion, and during the diffusion process, the drain lead region 107 extends sideways as well as downward. Therefore, in this example, the drain opening area is increased by using the area of the 2×2 source cell array for the area of the drain opening. In this example, the ratio between the area of the source cells and the area of the drain cell is 3:1. Accordingly, this embodiment improves the degree of integration of the channel, and makes it possible to reduce the on resistance. Furthermore, the distances of the source cells from the drain cell can be reduced to such an extent that the withstand voltage is not lowered. It is possible to reduce the resistance of the drain lead region 107 by making the size of the drain cell greater than the area of the 2×2 source cell array.

In the example shown in FIG. 1A, each drain opening is square and surrounded by a square gate zone, which is in turn surrounded by a square source perforated zone formed with twelve square source holes each having inner and outer parallel sides defining inner and outer parallel boundary line segments of the source zone. Each of the square gate and source zones is a zone bounded between inner and outer square closed boundary lines each having two opposite vertices lying on one diagonal line of the square drain opening and the other two vertices lying on the other diagonal line of the square drain opening. The drain lead region 107 is formed in each drain cell, and the source and base regions 105 and 110 are formed in each source cell.

Figure 2A:
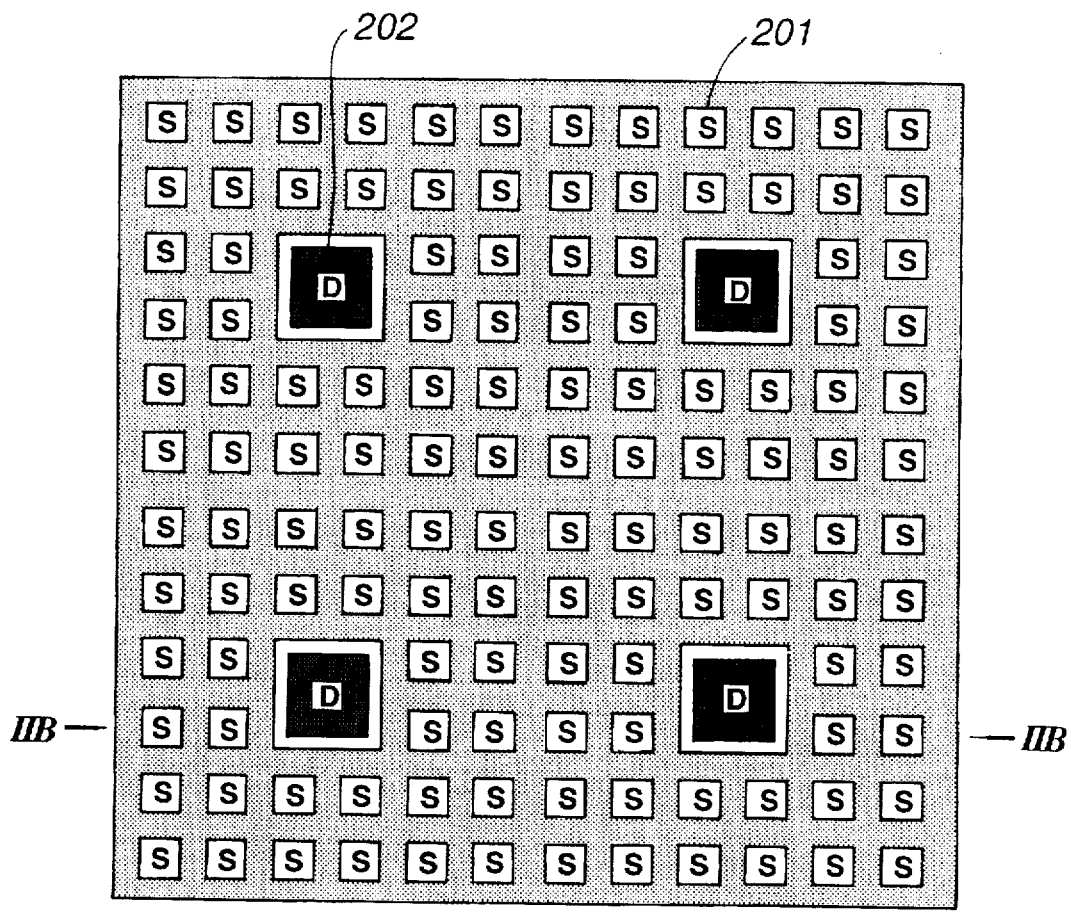
FIG. 2A is a plan view showing a planar electrode pattern of a semiconductor device according to a second embodiment of the present invention.
Figure 2B:
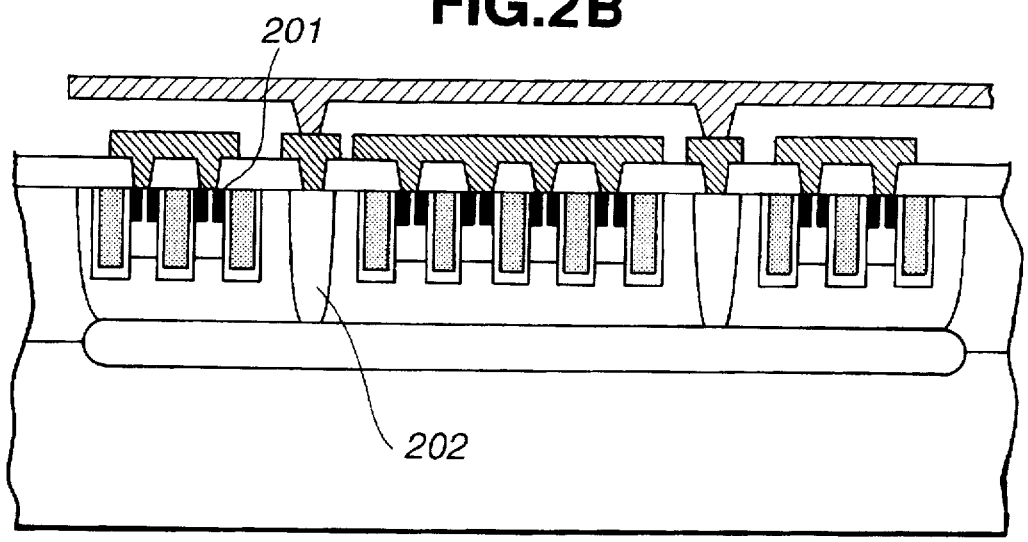
FIG. 2B is a sectional view of the semiconductor device taken across a line IIB—IIB of FIG. 2A.

A second embodiment of the present invention is shown in FIGS. 2A and 2B.

In the example shown in FIG. 2A, each unit cell has a 6×6 matrix of the source cells of which a central 2×2 matrix is used as a drain lead region 202. The drain cell of the example shown in FIG. 2A is surrounded by an inner source perforated zone having twelve squarely arranged source cells and an outer source perforated zone of twenty squarely arranged source cells. The inner source perforated zone surrounds an inner square gate zone which surrounds the drain cell. The outer source perforated zone is separated from the inner source perforated zone by an outer gate zone surrounding the inner source perforated zone. In this example, the ratio between the area of the source cells and the drain cell is 8:1. The second embodiment can further improve the degree of integration of the channel, and reduce the on resistance.

Figure 3:
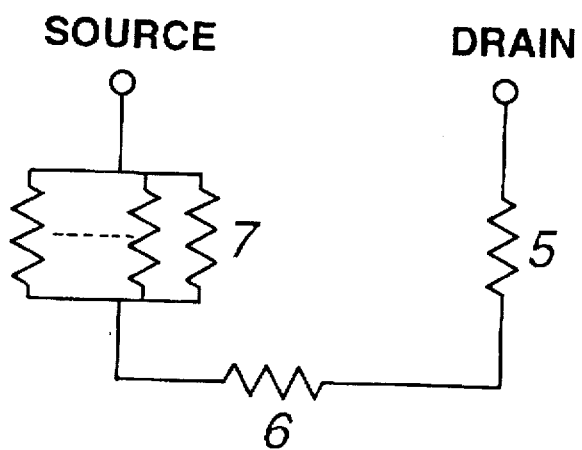
FIG. 3 is a diagram of a circuit model for showing an on resistance of the device of the first embodiment.

This technique of increasing the density of the source cells is effective when the ratio of the channel resistance is great as compared to the drain lead resistance in the total on resistance. FIG. 3 shows a network of resistances constituting the on resistance in the example shown in FIGS. 1A and 1B. In FIG. 3, a lead resistance 5 is a resistance of the drain lead region 107, and a first buried resistance 6 is a resistance of the buried layer 102. Each of first cell resistances 7 is a resistance of each source cell portion which is a combined resistance of a source resistance, a channel resistance, and a spreading resistance of the epitaxial layer 103. The first cell resistances 7 are connected in parallel to the number of the source cells as shown in FIG. 3.

Figure 4:
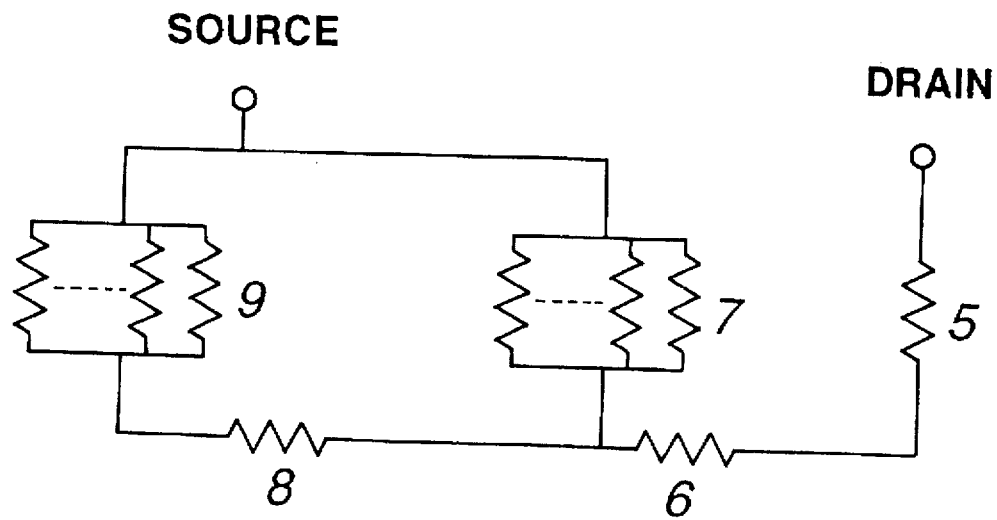
FIG. 4 is a diagram of a circuit model for showing an on resistance of the device of the second embodiment.
Figure 5:
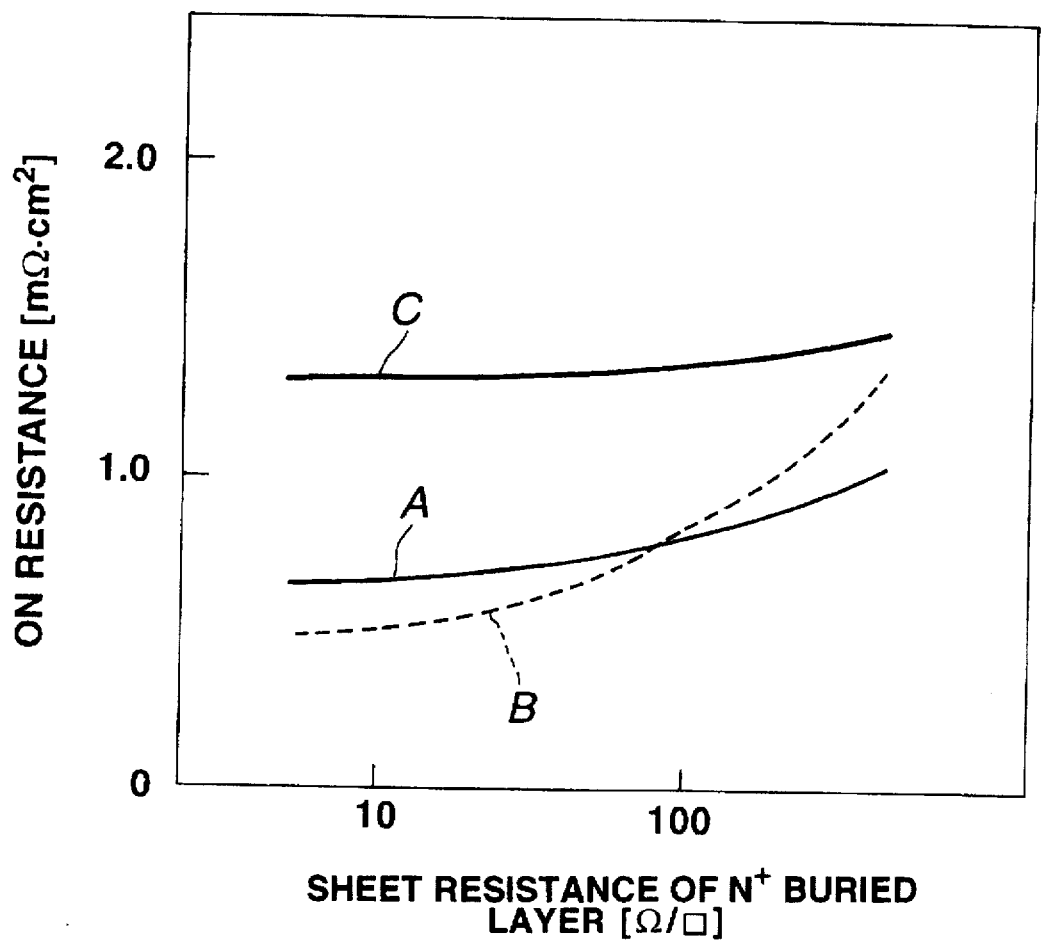
FIG. 5 is a graph showing a relationship of the on resistance with respect to the sheet resistance of a buried layer in each of the first and second embodiments.

FIG. 4 shows a resistance network of the example shown in FIGS. 2A and 2B. The device shown in FIGS. 2A and 2B has the outer enclosure of 20 source cells in addition to the inner enclosure of 12 source cells. Therefore, the resistance network of FIG. 4 further includes a parallel combination of resistances 9, and a second buried resistance 8 of the buried layer 102. FIG. 5 shows the results of calculation of the on resistances. FIG. 5 shows the on resistance of the first embodiment by a curve A, the on resistance of the second embodiment by a curve B, and the on resistance of the third conventional device by a curve C, with respect to the sheet resistance of the buried layer 102. From FIG. 5, it is evident that the first and second embodiments of the present invention can reduce the on resistance significantly as compared with the conventional design specifically when the buried resistance is low. When the sheet resistance of the buried layer is further reduced, the second embodiment is superior in reducing the on resistance to the first embodiment. When the percentage of the buried resistance is reduced in the total on resistance, the percentage of the cell resistances is increased. As a result, the increase of the number of the source cells surrounding each drain lead region becomes more effective in reducing the cell resistance.

When, on the other hand, the sheet resistance is equal to or higher than a predetermined level, the second embodiment is not superior in decreasing the on resistance of the whole device. In this case, even though the number of rows of the source cells is increased, the on resistance of the entirety of the device is increased under the influence of a resistance increase due to an increase of the distance from the source cells to the drain takeout portion. Accordingly, when the sheet resistance is equal to or greater than the predetermined value, the on resistance of the whole device can be decreased by the design in which the number of rows of the source cells is small, and the distance from the source cells to the drain lead region is short. Thus, it is advisable to determine the number of rows of the source cells properly in accordance with the sheet resistance of the buried layer and the resistance of the drain lead regions.

Figure 6A:
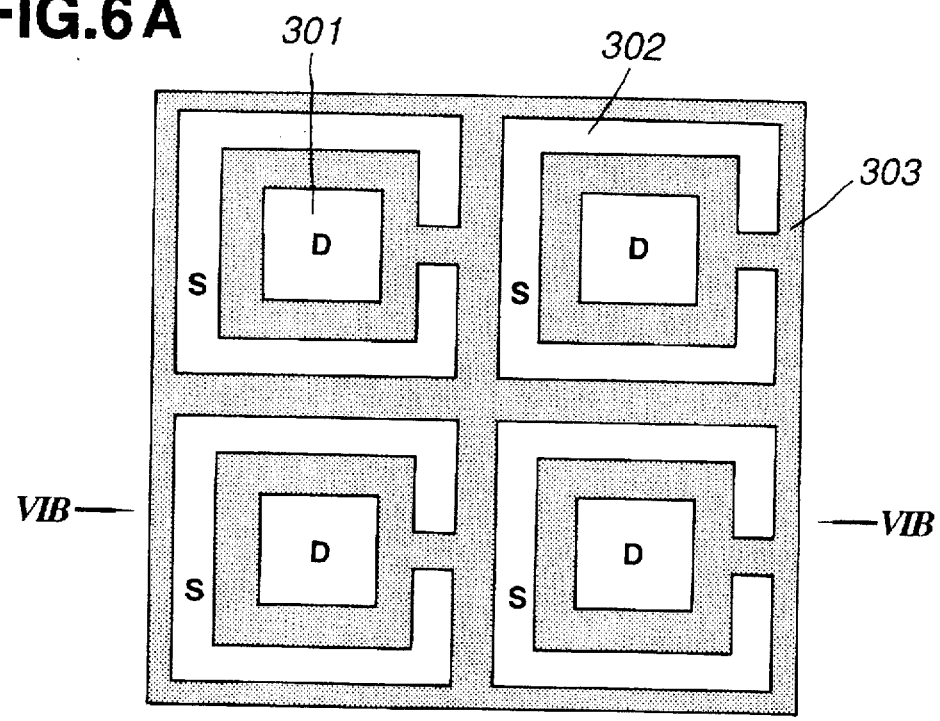
FIG. 6A is a plan view showing a planar electrode pattern of a semiconductor device according to a third embodiment of the present invention.
Figure 6B:
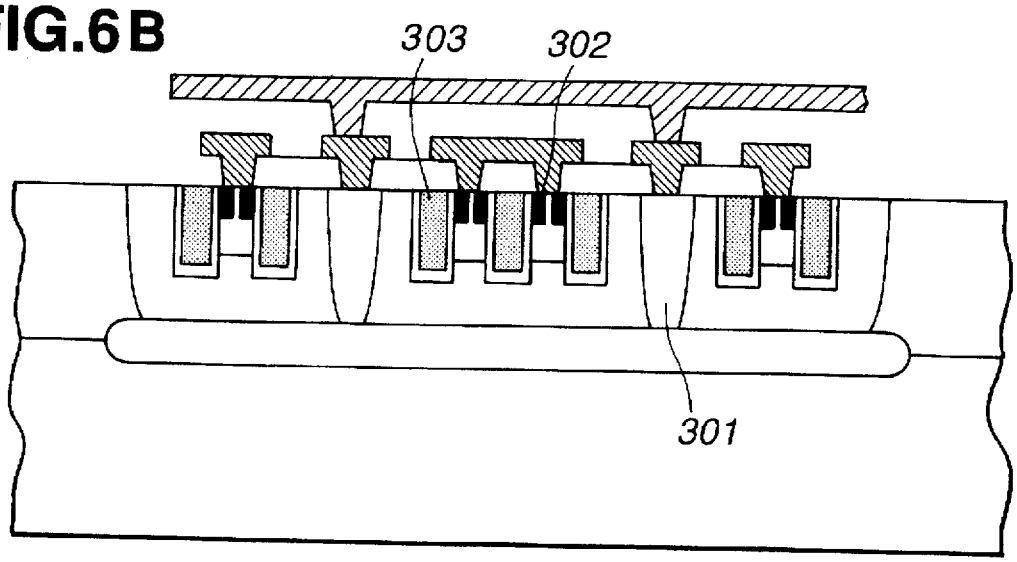
FIG. 6B is a sectional view of the semiconductor device taken across a line VIB—VIB of FIG. 6A.
Figure 6C:
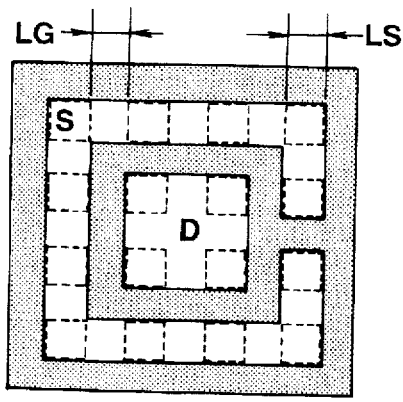
FIG. 6C is a plan view schematically showing a unit cell of the pattern of FIG. 6A.

A third embodiment of the present invention is shown in FIGS. 6A, 6B and 6C. The cross sectional structure shown in FIG. 6B is substantially identical to the structure shown in FIG. 1B of the first embodiment. However, the planar pattern shown in FIG. 6A is different from the pattern of the first embodiment. As schematically shown in FIG. 6C, the source cells are connected to form a stripe-shaped source region 302. This design can substantially increase the channel width as compared with the design of the first embodiment when the width (LG) of the U-shaped gate is greater than the width (LS) of the source cells.

In the example shown in FIG. 6A, an intercellular gate network has a plurality of square meshes. FIG. 6A shows four square meshes. In each of the square meshes, there are formed one square gate zone connected with the gate network by a bridge portion which, in this example, extends from the middle of the right side of the square zone rightward as viewed in FIG. 6A to the adjacent straight segment of the network.

Figure 7A:
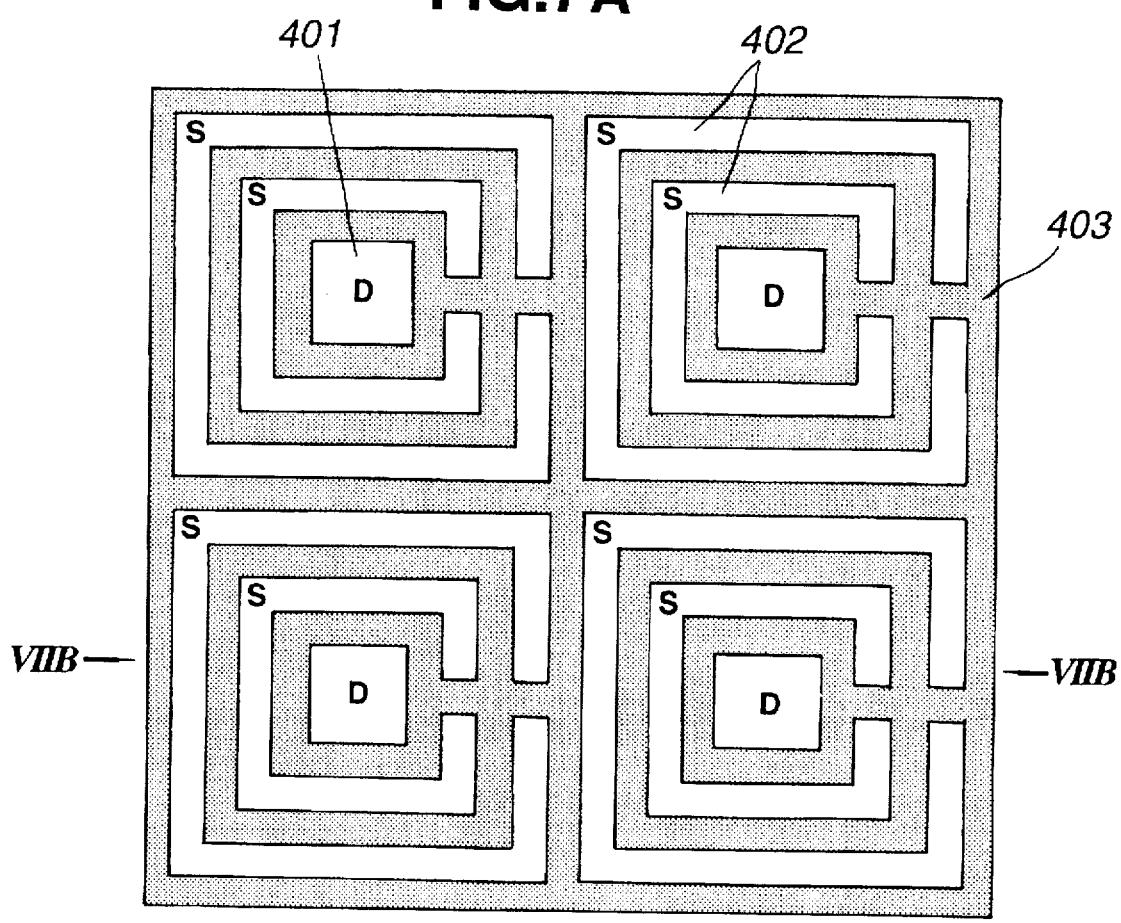
FIG. 7A is a plan view showing a planar electrode pattern of a semiconductor device according to a fourth embodiment of the present invention.
Figure 7B:
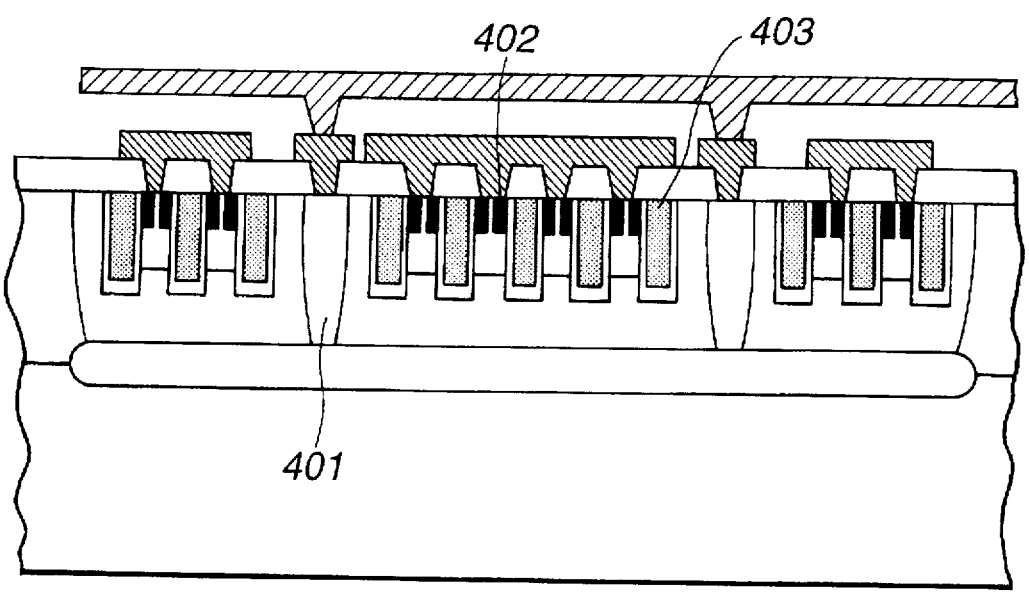
FIG. 7B is a sectional view of the semiconductor device taken across a line VIIB—VIIB of FIG. 7A.

A fourth embodiment of the present invention is shown in FIGS. 7A and 7B. The sectional structure shown in FIG. 7B is substantially identical to the structure of the second embodiment shown in FIG. 2B. The planar pattern of the fourth embodiment shown in FIG. 7A is somewhat similar to the pattern of the third embodiment shown in FIG. 6A. Each drain lead region 401 is surrounded by an inner stripe-shaped source region 402, and an outer stripe-shaped source region 402. This pattern can decrease the on resistance when the sheet resistance of the buried layer is low and the gate width is greater than the source width.

Figure 8:
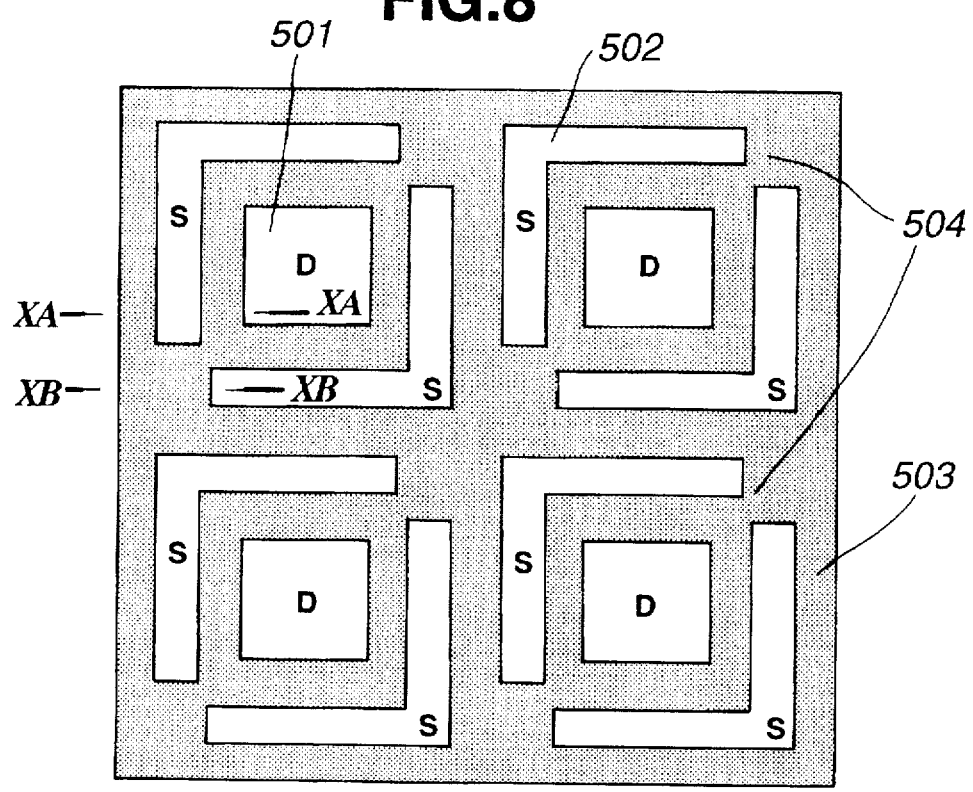
FIG. 8 is a plan view showing a planar electrode pattern of a semiconductor device according to a fifth embodiment of the present invention.

A fifth embodiment of the present invention is shown in FIG. 8. In the planar pattern shown in FIG. 8, the stripe-shaped source region is divided into two half sections. Each drain cell is surrounded by an inner gate zone which is in turn surrounded by the source zone having the two half sections of the stripe-shaped source region. The inner gate zone is connected with the surrounding gate area by two bridge portions 504, one formed between adjacent ends of the half sections, and the other formed between the other ends of the half sections. This design can decrease the difference in the gate resistance near each source region 502. Specifically, this design can decrease the gate resistance in the portion remote from the bridge portions 504. Therefore, this embodiment can reduce the time constant of the gate charging, and enables the high speed operation of the driver.

In this example, the bridge portions 504 are formed at the diagonally opposite corners of the square source zone.

Figure 9:
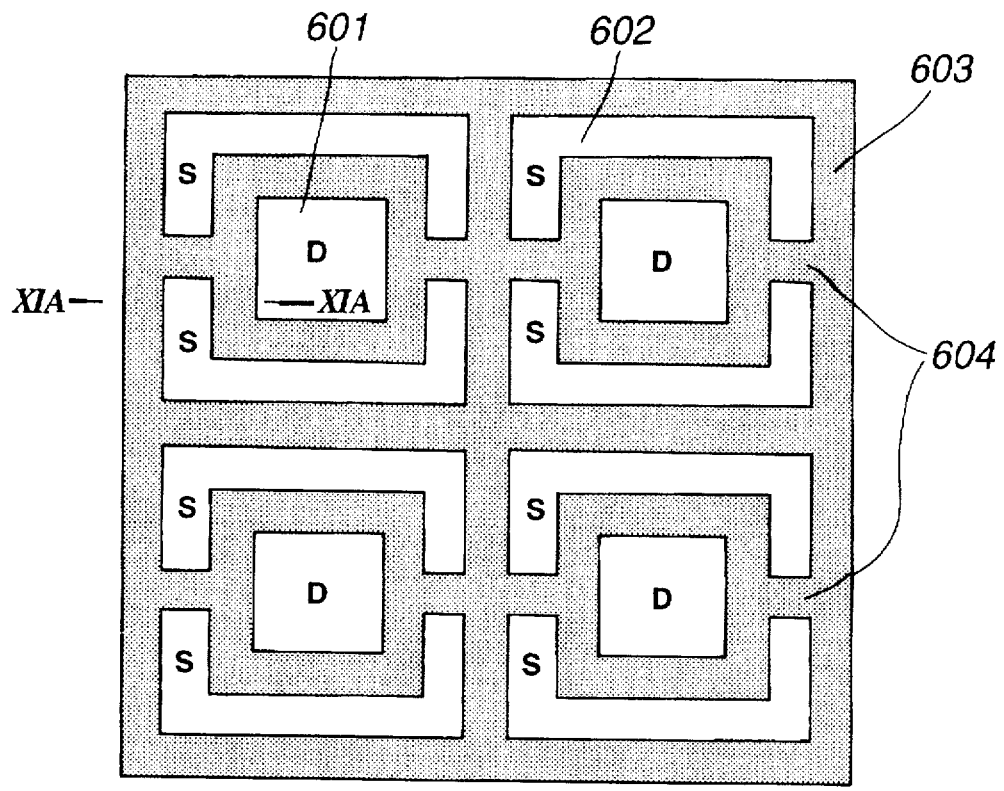
FIG. 9 is a plan view showing a planar electrode pattern of a semiconductor device according to a sixth embodiment of the present invention.

A sixth embodiment of the present invention is shown in FIG. 9. In this embodiment, there are formed two of bridge portions 604 for each drain lead region 601 like the fifth embodiment, so that the sixth embodiment is expected to provide the same effect. The design of the sixth embodiment further possesses the following advantage.

Figure 10:
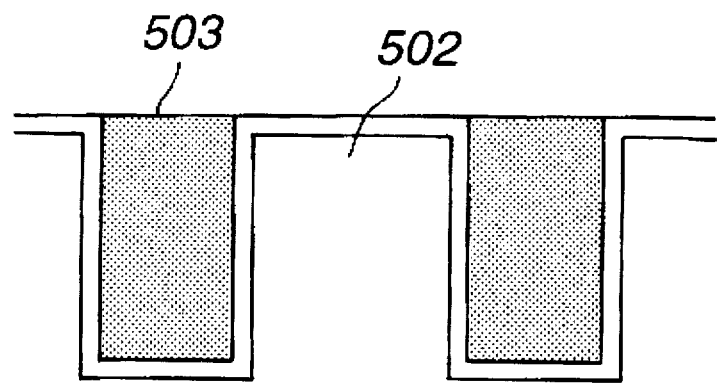
FIG. 10A is a sectional view taken across a line XA—XA shown in FIG. 8.
FIG. 10B is a sectional view taken across a line XB—XB shown in FIG. 8.
Figure 10:
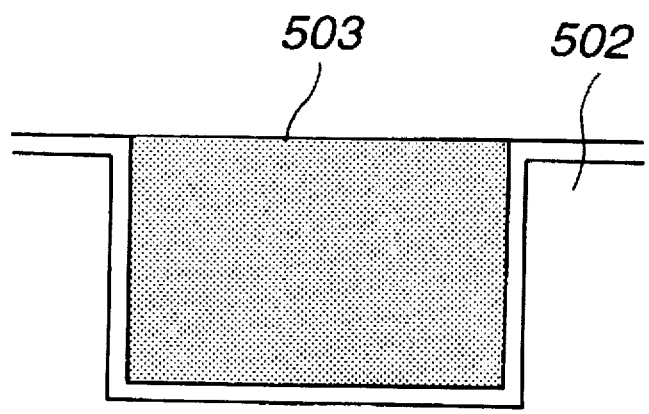

FIGS. 10A and 10B shows the U gate portions in section taken across lines XA—XA and XB—XB in FIG. 8. FIGS. 11A-11D are sectional views taken across a line XIA—XIA in FIG. 9. These sectional views are simplified, and the diffused regions and other electrode are omitted. In the fifth embodiment shown in FIGS. 10A and 10B, there are formed the U gate portions of two different widths. By contrast, the U gate portions in the sixth embodiment shown in FIGS. 11A-11D have the same width.

Figure 11A:
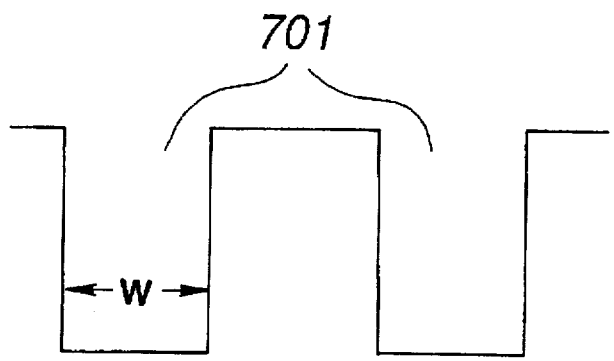
FIGS. 11A~11D are sectional views taken across a line XIA—XIA shown in FIG. 9, for illustrating a process for forming U gate portions.
Figure 11B:
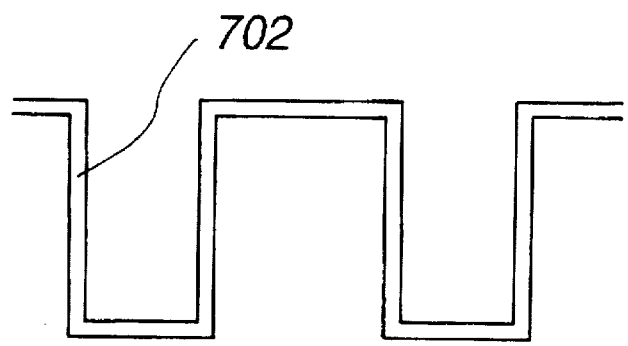
Figure 11C:
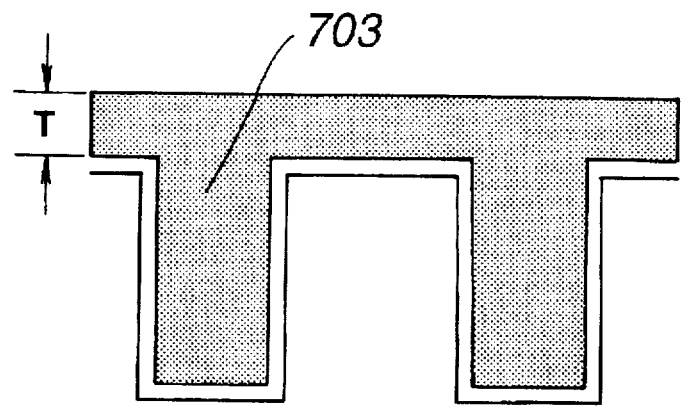
Figure 11D:
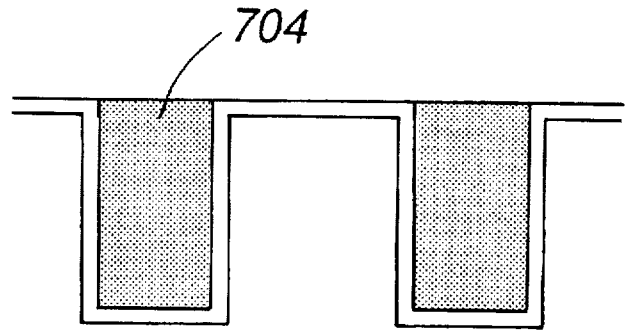

In general, U gate portions 704 are formed as shown in FIGS. 11A-11D. First, U-shaped grooves (or trenches) 701 are formed in the semiconductor substrate by reactive ion etching as shown in FIG. 11A. Thereafter, a gate oxide film 702 is formed by oxidation of the semiconductor surface, as shown in FIG. 11B. The grooves 701 are then filled and covered with polysilicon 703 for the gate electrode. The next step is an etch back operation to form the U gate portions 704 by removing the polysilicon by reactive ion etching, leaving the polysilicon only in the grooves 701.

In this fabrication process, the thickness T of the polysilicon layer covering the grooves 701 is required to be from a half of the width W of the U-shaped grooves 701 to a value approximately equal to the groove width W in order to fill the grooves with the polysilicon satisfactorily. In the fifth embodiment shown in FIGS. 8, 10A and 10B, therefore, the polysilicon layer must be thick enough to fill the wider groove shown in FIG. 10B. In the sixth embodiment, by contrast, the thickness of the polysilicon layer can be reduced because the grooves are uniform and small in width. The sixth embodiment can reduce the time and cost required for the process for forming the U gate portions 704.

Figure 12:
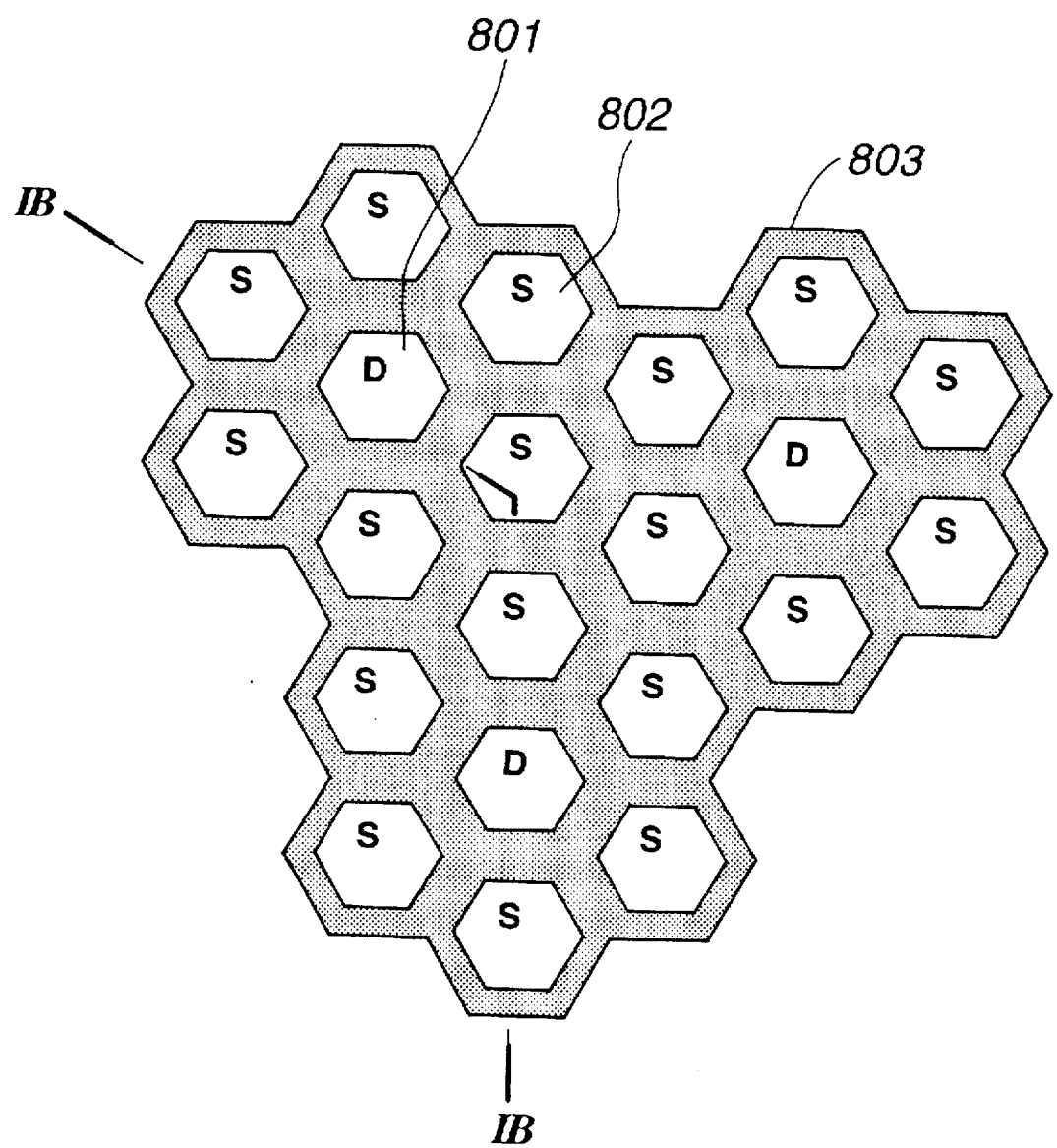
FIG. 12 is a plan view showing a planar electrode pattern of a semiconductor device according to a seventh embodiment of the present invention.

A seventh embodiment of the present invention is shown in FIG. 12. A cross section taken across a line IB—IB in FIG. 12 is substantially identical to the cross section of FIG. 1B. In the planar pattern shown in FIG. 12, each drain lead region 801 is in the shape of a regular hexagon, and surrounded by six source regions 802 which are each in the shape of a regular hexagon, and which are regularly arranged in a regular hexagon. This pattern is the most dense pattern in which the area of the source cell region can be increased sufficiently while maintaining the required distance between the source cell and drain cell to prevent a decrease of the drain-source withstand voltage of the device. Thus, this embodiment can further reduce the on resistance by utilizing the limited area more efficiently.

Figure 13:
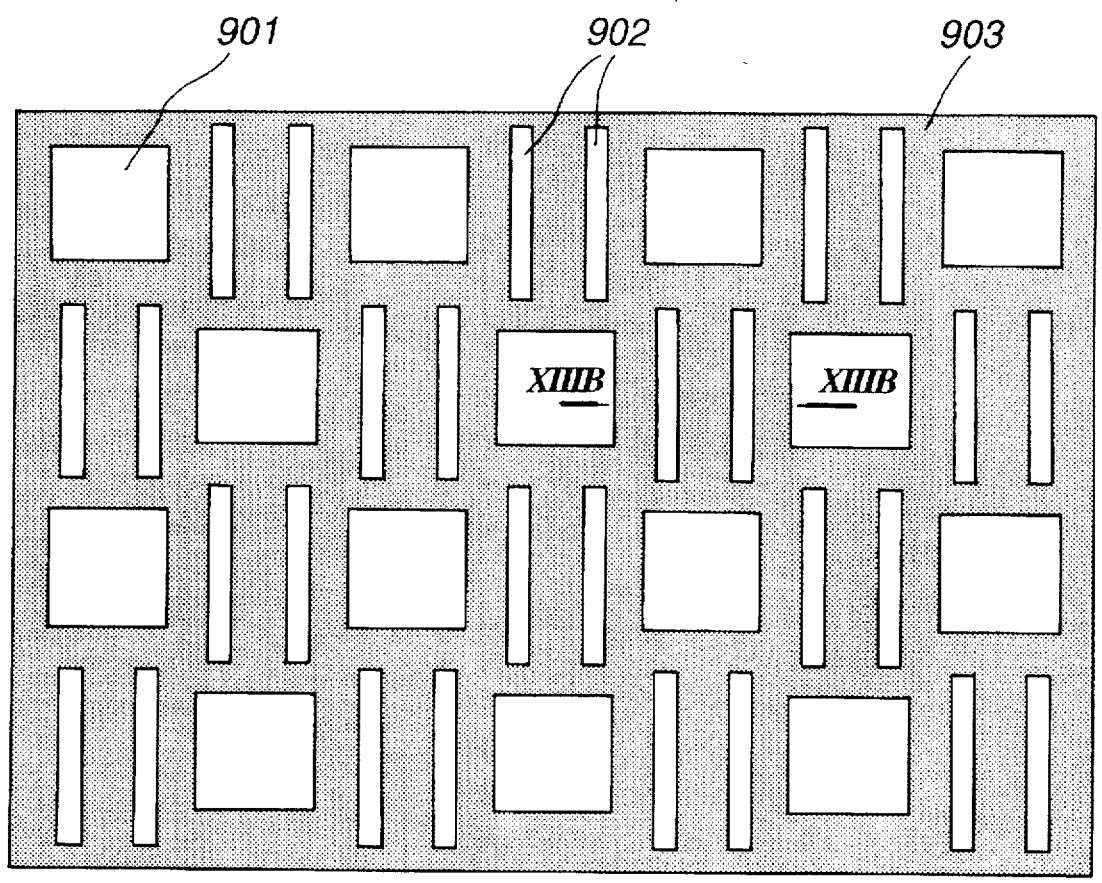
FIG. 13A is a plan view showing a planar electrode pattern of a semiconductor device according to an eighth embodiment of the present invention.
FIG. 13B is a sectional view of the semiconductor device taken across a line XIIIB—XIIIB of FIG. 13A.
Figure 13:
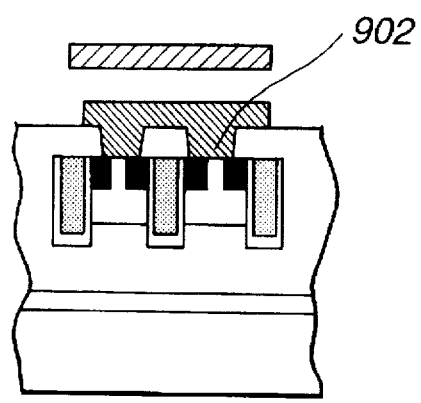

An eighth embodiment of the present invention is shown in FIGS. 13A and 13B. In the planar pattern shown in FIG. 13A, stripe-shaped straight source regions 902 are regularly-arranged in stripes, and square or rectangular drain lead regions 901 are regularly distributed in the striped pattern of the source regions 902. In this example, two of the stripe-shaped source regions 902 are formed between two adjacent drain cells. It is possible to vary the number of the striped-shaped source regions 902 between two adjacent drain lead regions 901 in accordance with the sheet resistance of the buried layer as explained in the second embodiment.

Figure 14A:
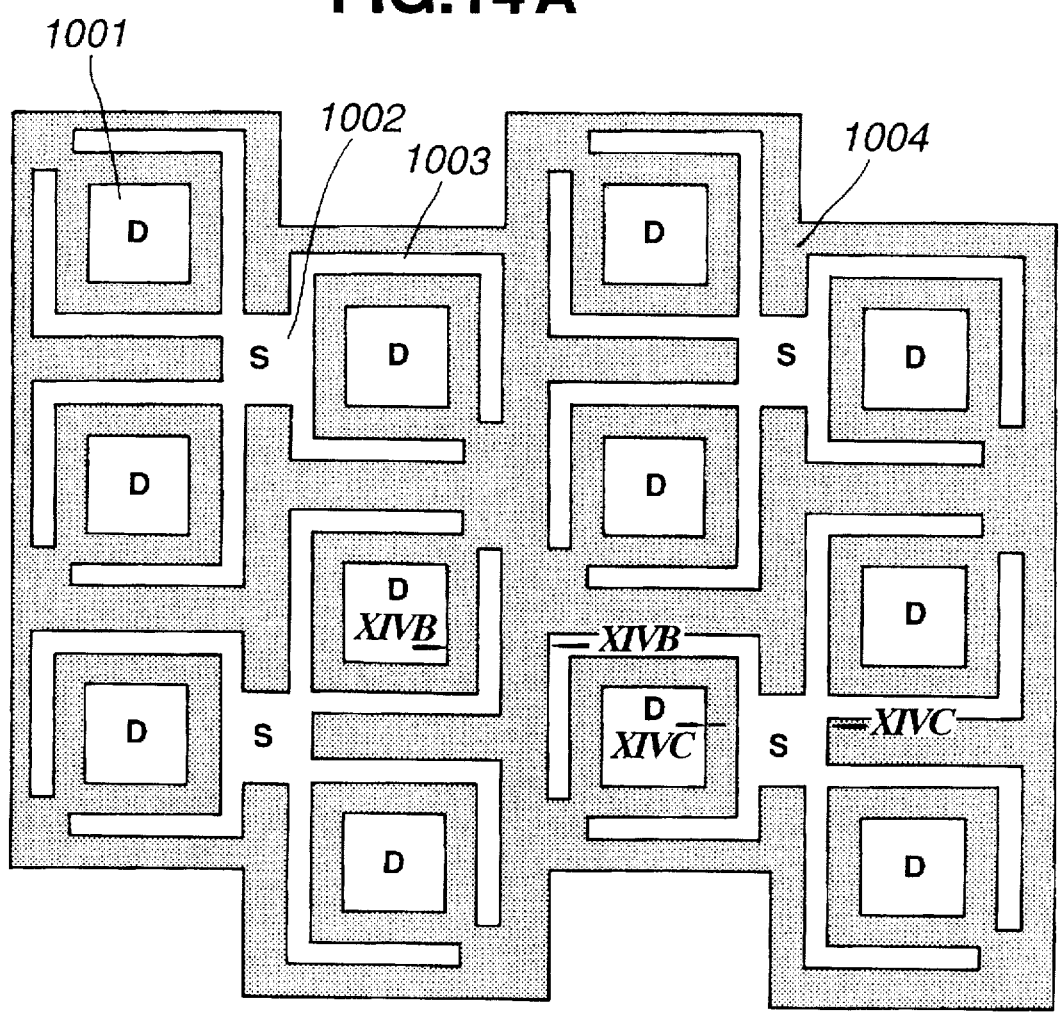
FIG. 14A is a plan view showing a planar electrode pattern of a semiconductor device according to a ninth embodiment of the present invention.
Figure 14B:
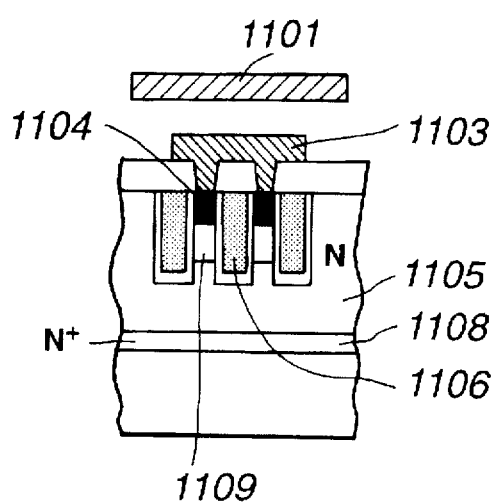
FIG. 14B is a sectional view of the semiconductor device taken across a line XIVB—XIVB of FIG. 14A.
Figure 14C:
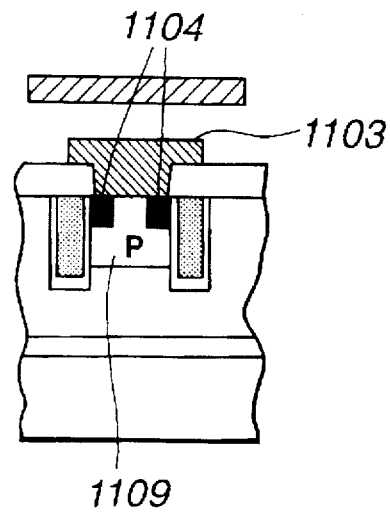
FIG. 14C is a sectional view of the semiconductor device taken across a line XIVC—XIVC of FIG. 14A.

A ninth embodiment of the present invention is shown in FIGS. 14A, 14B and 14C. In this embodiment, each source region comprises a wide region 1002 and a stripe-shaped narrow regions 1003. In the wide region 1002, as shown in FIG. 14C, the source electrode 1103 is in contact with both of the source region and the P type base region 1109. On the other hand, in the narrow region 1003, as shown in FIG. 14B, the source electrode 1103 is connected only to the source region 1104, and the P base region 1109 is not in direct contact with the source electrode 1103.

In the example of FIG. 14A, each source region has one wide region 1002, and three stripe-shaped square-extending narrow regions 1003 each surrounding one drain lead region 1001. Three narrow source regions 1003 are connected together in the wide region 1002. This basic unit pattern including three drain lead regions 1001 is regularly repeated in a plane. In this example, the source electrode 1103 is connected with the P base region 1109 only in the wide region 1002 having the P base contact, and the width of the narrow regions 1003 having no P base contact is reduced. Therefore, this embodiment can reduce the pitch of repetition of the basic pattern, and further reduce the on resistance by reducing the peripheral length of the channel per unit area.

Figure 15A:
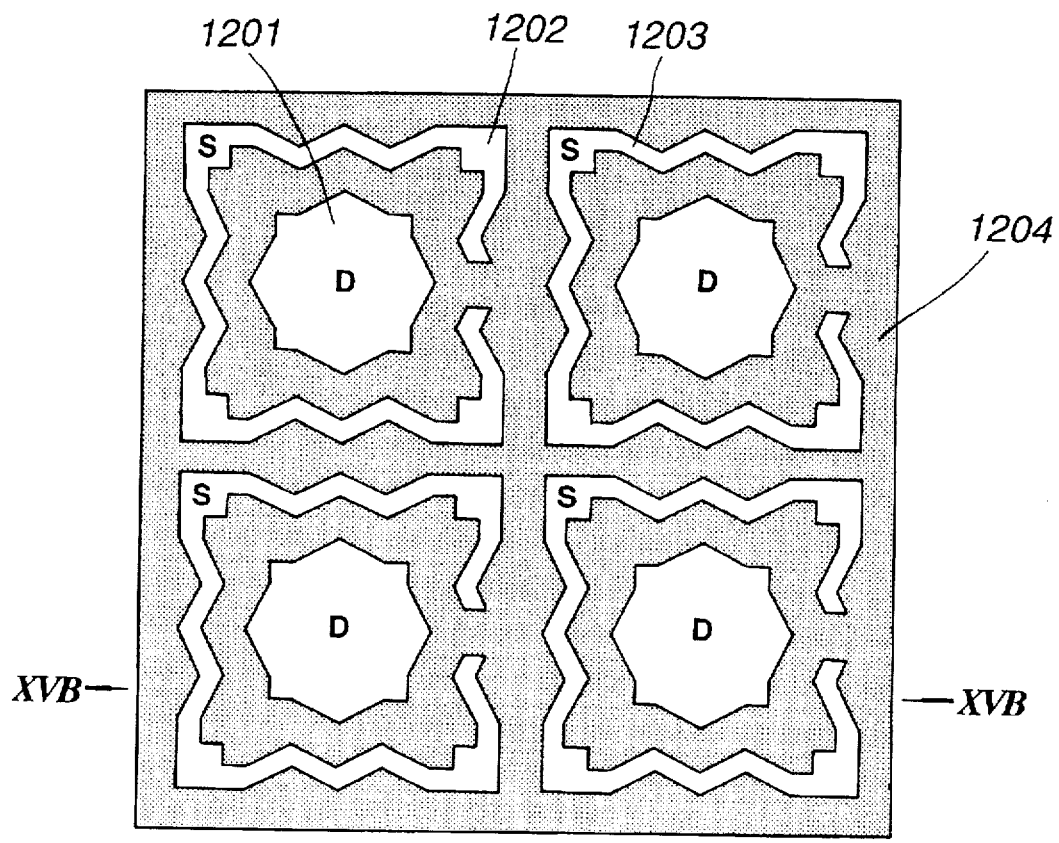
FIG. 15A is a plan view showing a planar electrode pattern of a semiconductor device according to a tenth embodiment of the present invention.
Figure 15B:
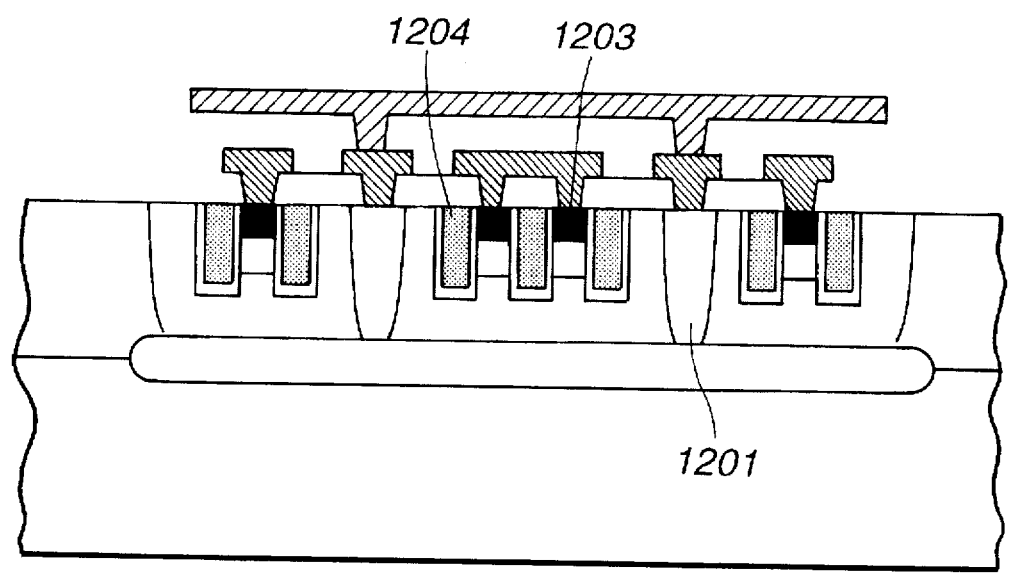
FIG. 15B is a sectional view taken across a line XVB—XVB of FIG. 15A.

A tenth embodiment of the present invention is shown in FIGS. 15A and 15B. In this embodiment, each source region surrounding one drain lead region 1201 comprises wide regions 1202 having the P base contact and a stripe-shaped narrow regions 1203 having no P base contact. Since the connection between the P base region and the source electrode is not required, the width of the narrow regions 1203 can be reduced, and extended in a zigzag as shown in FIG. 15A. In the example, each source region surrounds one drain lead region 1201 and has four corners. The four wide regions 1202 are formed, respectively, in the four corners, and connected with one another by three continuous zigzag narrow regions 1203 on the left, lower and upper sides as viewed in FIG. 15A, and one right side zigzag narrow region which is divided in the middle into two segments by a gate bridge portion, as viewed in FIG. 15A. This embodiment can further reduce the on resistance by reducing the channel length per unit area.

Figure 16:
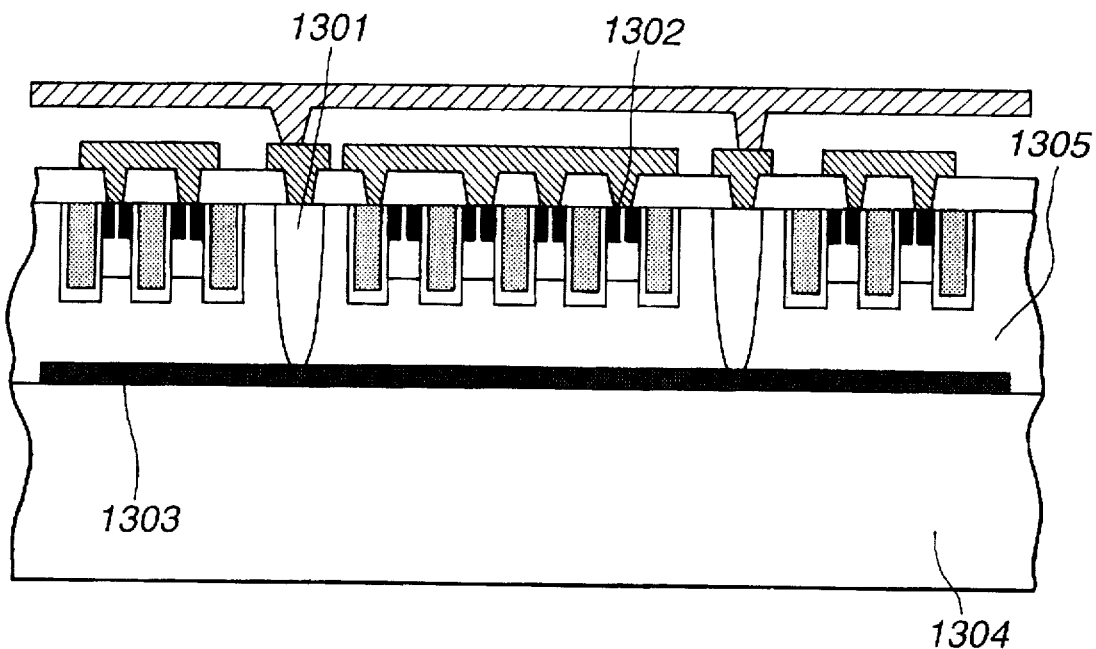
FIG. 16 is a sectional view showing a semiconductor device according to an eleventh embodiment of the present invention.

An eleventh embodiment of the present invention is shown in FIG. 16. In this embodiment, a low resistance layer 1303 of silicide is formed on one major surface of a first semiconductor substrate 1304, and buried under the top semiconductor surface, in place of the heavily doped $N^+$ buried layer 102 shown in FIG. 1A. The low resistivity silicide layer 1303 can reduce the resistance of the connection between the source region 1302 and the drain lead region 1301, and thereby contributes to the reduction of on resistance. To fabricate the structure shown in FIG. 16, for example, the low resistivity silicide layer 1303 is formed on a second semiconductor substrate 1305 by a known method. Subsequently, the second substrate 1305 is bonded with the first semiconductor substrate 1304 by a technique of wafer bonding, and then lapped to the required thickness. In the example shown in FIG. 16, an ordinary silicon substrate is used as the first substrate. It is, however, possible to employ a semiconductor substrate with an insulating film covering the whole or part of the semiconductor surface, and bury the insulating film in the complete substrate. The use of such an insulating film buried between lower and upper layers can improve the insulation performance as compared with the structure employing the PN junction isolation, and prevent the undesired latchup completely.

Figure 17:
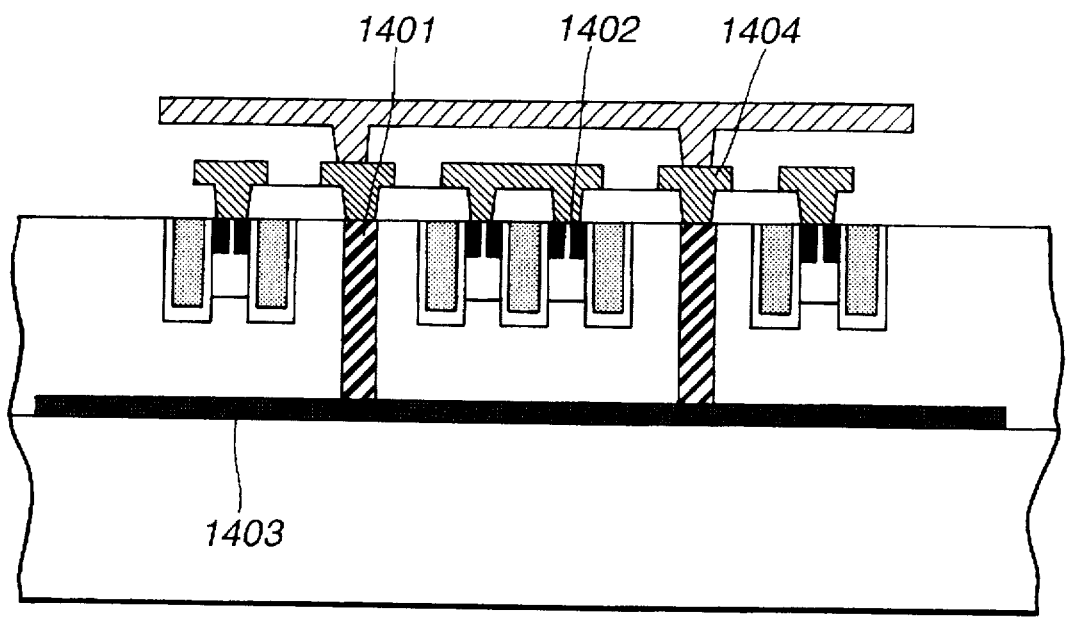
FIG. 17 is a sectional view showing a semiconductor device according to an twelfth embodiment of the present invention.

A twelfth embodiment of the present invention is shown in FIG. 17. In the structure shown in FIG. 17, drain lead regions 1401 are in the form of trenches filled with a low resistivity conductive material such as a polycrystalline silicon having a low resistivity or Al. The trench type drain lead regions 1401 extends vertically from the upper semiconductor surface to a buried layer 1403, and connects the drain electrode 1404 with the buried layer 1403. This embodiment can reduce the on resistance of the device by reducing the resistance of the drain lead regions. The trench technique can form deep and narrow trenches, and reduce the area of the drain lead regions as compared with the drain lead region formed by deep diffusion in the preceding embodiments. Therefore, this embodiment enables further improvement in the degree of integration, and on resistance reduction.

Figure 18:
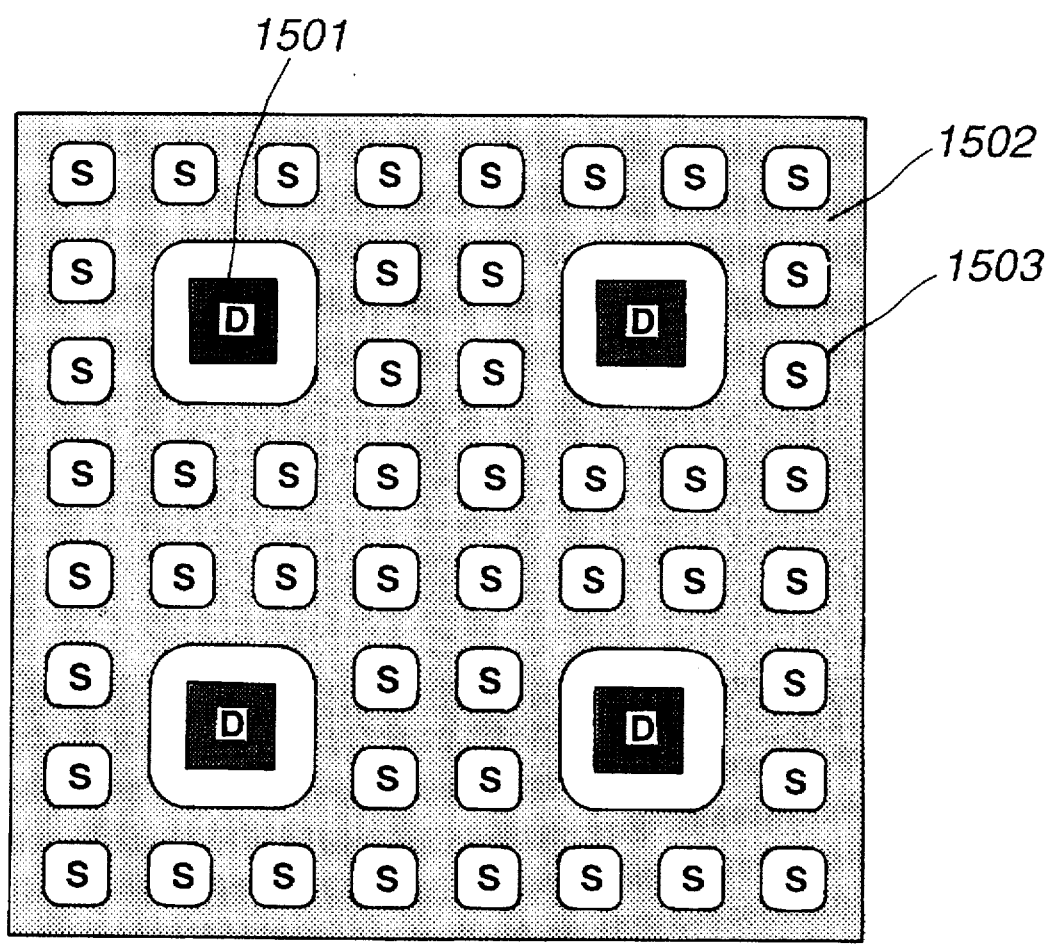
FIG. 18 is a plan view showing a planar electrode pattern of a semiconductor device according to a thirteenth embodiment of the present invention.
Figure 19A:
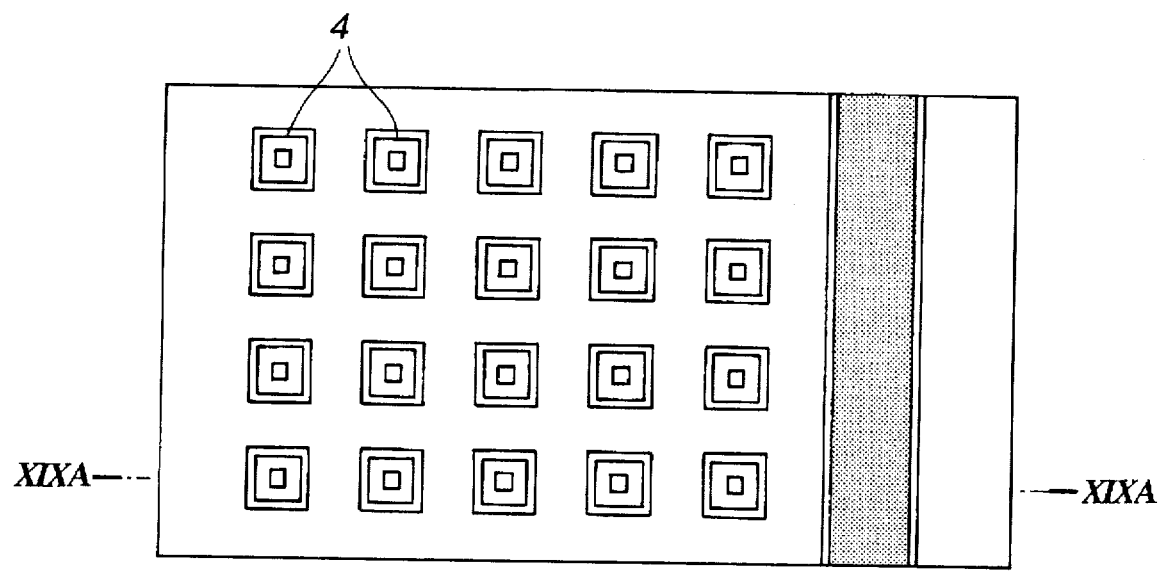
FIG. 19A is a plan view showing a planar electrode pattern of a groove-type semiconductor device of a first conventional example.
Figure 19B:
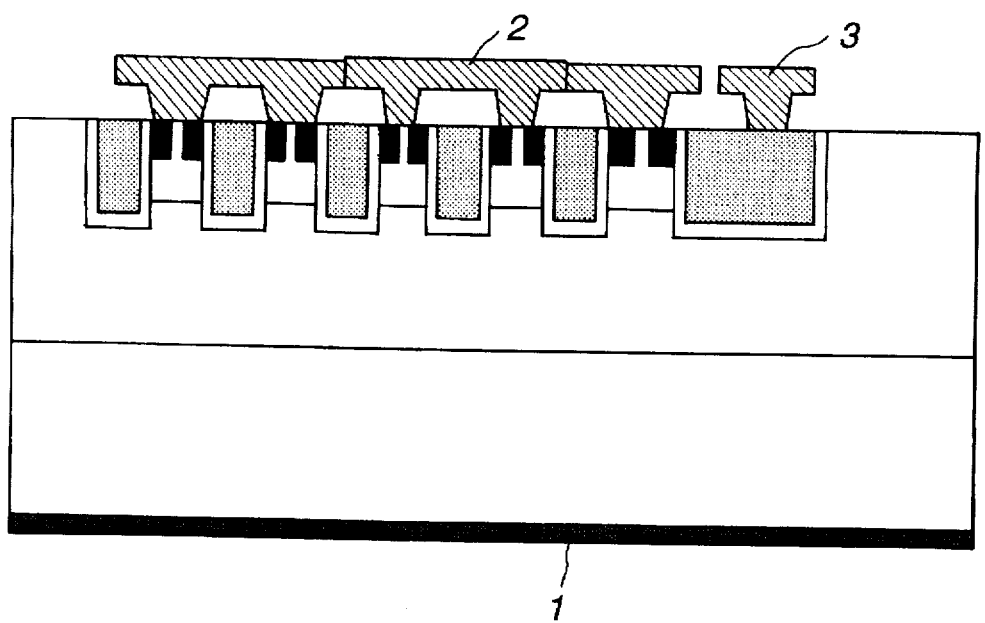
FIG. 19B is a sectional view taken across a line XIX—XIX of FIG. 19A.
Figure 20:
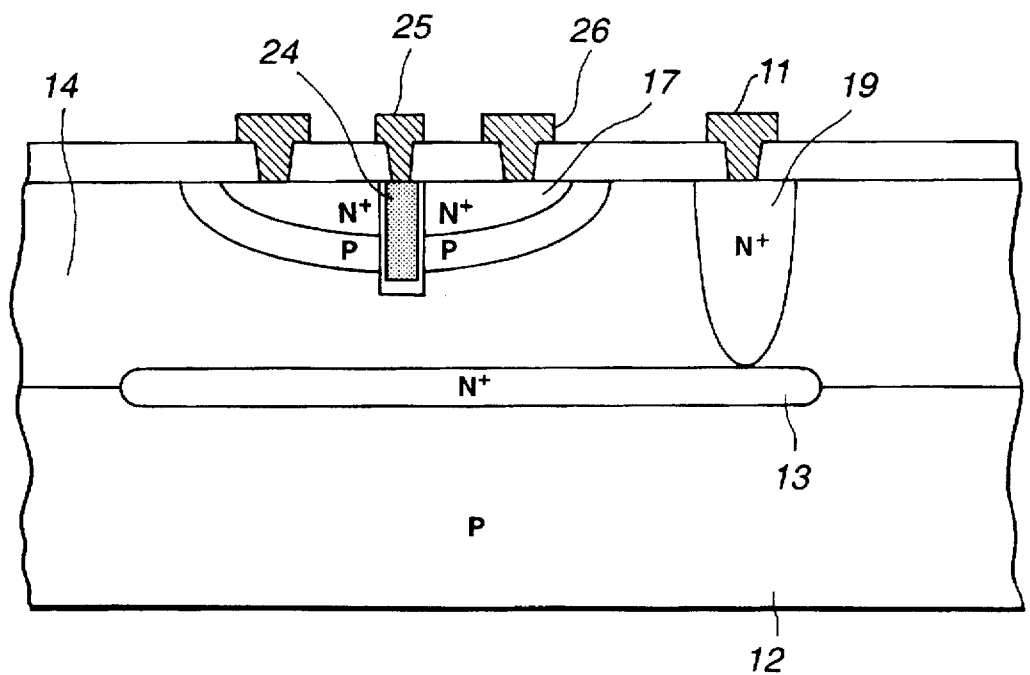
FIG. 20 is a sectional view of a groove-type semiconductor device of a second conventional example.
Figure 21A:
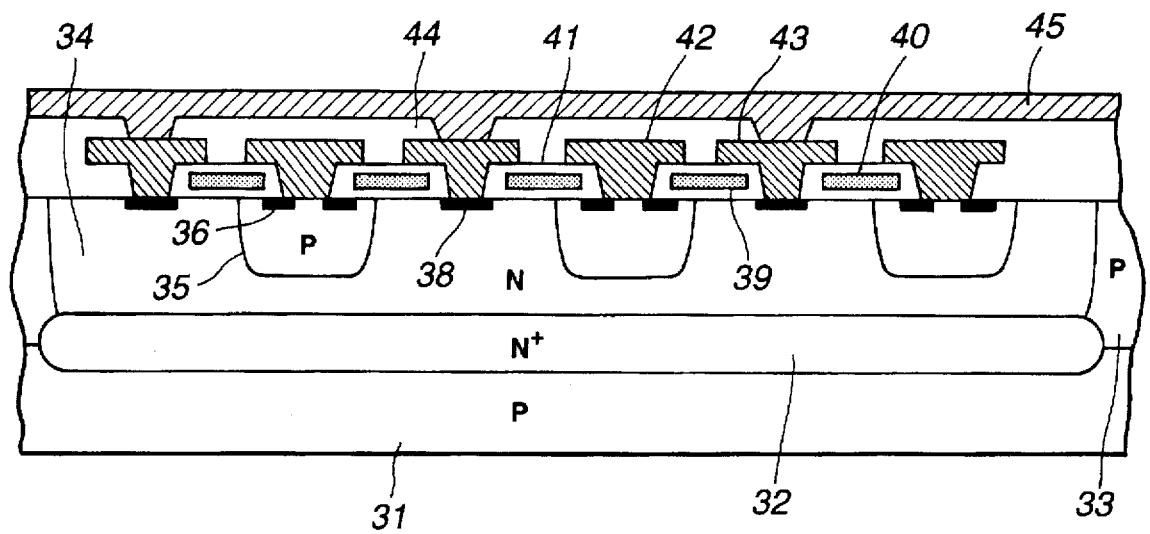
FIG. 21A is a sectional view of a semiconductor device according to a third conventional example.
Figure 21B:
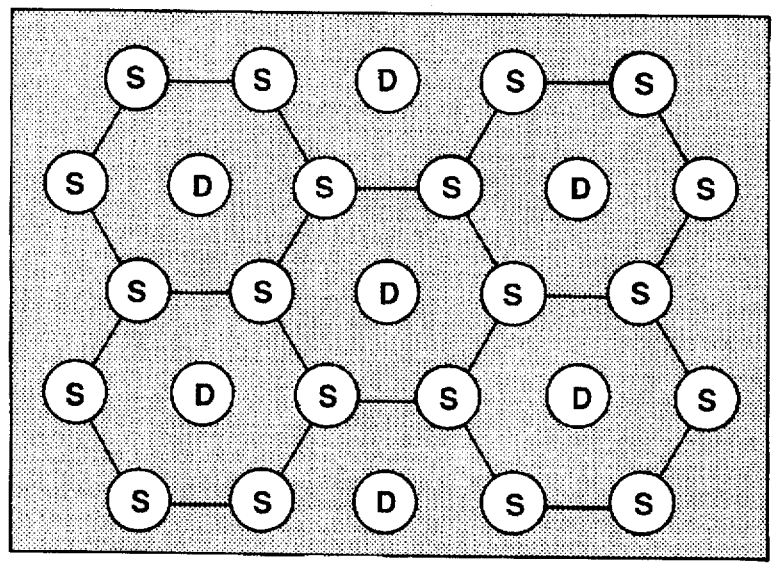
FIG. 21B is a plane view showing a planar electrode pattern of the third conventional example.

A thirteenth embodiment of the present invention is shown in FIG. 18. The planar electrode pattern shown in FIG. 18 is similar to that shown in FIG. 1A. In the example shown in FIG. 18, right angle corners of square drain lead regions 1501 and source regions 1503 are all rounded. That is, the corners of the U-shaped gate in the grooves are also rounded as viewed in the plan view. This rounded design can avoid concentration of stress and electric field, and improve the reliability in the fabricating process and the actual performance of the device.

As explained above, a semiconductor device according to the illustrated embodiments comprises: at least a drain region (104) of the N-type; a base region (110) of the P-type; a source region (105, 201, 302, 402, 502, 602, 802, 902, 1002, 1003, 1202, 1203, 1302, 1402, 1503) of the P type; a gate electrode (106, 303, 403, 503, 603, 704, 803, 903, 1004, 1106, 1204, 1502) formed in a groove and insulated by a gate insulating film, a drain electrode (109, 1101, 1404) and a source electrode (108, 1103) forming a lateral MOS transistor with the gate electrode; a low resistivity region (102, 1108, 1303, 1403) formed under the drain region; a drain lead region (107, 202, 301, 401, 501, 601, 801, 901, 1001, 1201, 1301, 1401, 1501) extending into the semiconductor substrate to the low resistivity region; and a first insulating layer (111) formed on the semiconductor substrate. The first insulating layer is formed with a drain opening for connecting the drain electrode with the drain lead region and a source opening for connecting the source electrode with the base region and the source region. The source and drain electrodes are formed in a double layer interconnection structure. The source opening extends around the drain opening so as to surround the drain opening, and the gate electrode is formed around the source opening.

What is claimed is:

1. A groove type semiconductor device comprising:
a drain region of a first conductivity type formed in a semiconductor substrate;
a base region of a second conductivity type extending into said semiconductor substrate from a first major surface of said semiconductor substrate to said drain region;
a source region of the first conductivity type extending into said semiconductor substrate from said first major surface to said base region;
a gate electrode insulated by a gate insulating film and formed in a groove extending into said semiconductor substrate from said first major surface and adjoining said base region and said source region;
a drain electrode and a source electrode which are both formed above said first major surface of said semiconductor substrate to form a lateral U-shaped sectional shape metal oxide semiconductor (UMOS) with said gate electrode;
a low resistivity region formed under said drain region;
a drain lead region extending into said semiconductor substrate from said first major surface to said low resistivity region; and
a first insulating layer formed on said first major surface of said semiconductor substrate, said first insulating layer being formed with a drain opening for connecting said drain electrode with said drain lead region and a source opening for connecting said source electrode with said base region and said source region;
wherein one of said source and drain electrodes comprises a first level conductive portion formed on said first insulating layer, the other of said source and drain electrodes comprises a second level conductive portion, and said semiconductor device further comprises a second insulating layer formed between said first and second level conductive portions so as to form a double layer interconnection structure in which said first and second level conductive portions are insulated from each other by said second insulating layer;
wherein said source opening extends around said drain opening so as to surround said drain opening, and said gate electrode is formed around said source opening;
wherein said source opening comprises one of a stripe-shaped opening and a series of separate openings, and extends around said drain opening along a shape similar to a frame of said drain opening and, said first insulating layer is formed with a plurality of said drain openings and a plurality of said source openings, which are regularly arranged; and
wherein a plurality of said source openings extend between two adjacent ones of said drain openings.

2. A semiconductor device as claimed in claim 1 wherein said low resistivity region is one of a highly doped semiconductor layer and a layer of silicide.

3. A semiconductor device as claimed in claim 1 wherein said drain lead region includes a trench filled with an electrically conductive material having a low resistance.

4. A semiconductor device as claimed in claim 1 wherein each of said drain opening and said source opening comprises at least one corner which bounds said gate electrode and which is rounded.

5. A semiconductor device comprising:
a drain region of a first conductivity type formed in a semiconductor substrate;
a base region of a second conductivity type extending into said drain region from a first major surface of said semiconductor substrate;
a source region of the first conductivity type extending into said base region from said first major surface;
a gate electrode insulated by a gate insulating film and formed in a groove extending into said semiconductor substrate from said first major surface and adjoining said base region and said source region;
a drain electrode and a source electrode which are both formed above said first major surface of said semiconductor substrate to form a lateral U-shaped sectional shape metal oxide semiconductor (UMOS) with said gate electrode;
a low resistivity region formed under said drain region in said semiconductor substrate;
a drain lead region extending into said drain region from said first major surface to said low resistivity region; and
a first insulating layer formed on said first major surface of said semiconductor substrate, said first insulating layer being formed with a drain opening for connecting said drain electrode with said drain lead region and a first source opening zone for connecting said source electrode with said source region along said first source opening zone;
wherein one of said source and drain electrodes comprises a first level conductive portion formed on said first insulating layer, the other of said source and drain electrodes comprises a second level conductive portion, and said semiconductor device further comprises a second insulating layer formed between said first and second level conductive portions so as to form a double layer interconnection structure in which said first and second level conductive portions are insulated from each other by said second insulating layer;
wherein said first source opening zone extends around said drain opening so as to surround said drain opening, and said gate electrode is formed around said source opening; and
wherein said first insulating layer is formed with a plurality of said drain openings and a plurality of said first source opening zones, said drain openings and said first source opening zones are regularly arranged on said first major surface and separated from one another by a gate area in which said gate electrode is formed, and each of said drain openings is accompanied by a unique one of said source opening zones so that any two adjacent drain openings are separated by a plurality of said source opening zones extending therebetween.

6. A semiconductor device as claimed in claim 5 wherein each of said drain openings is in a radially symmetric shape, each of said drain openings is surrounded at least partly by a unique one of said first source opening zones, and each of said first source opening zones comprises two opposite portions which are symmetrical with respect to a center of a unique one of said drain openings.

7. A semiconductor device as claimed in claim 6 wherein said gate area comprises a plurality of inner gate zones, and an intercellular gate network, each of said drain openings is surrounded by a unique one of said inner gate zones, which is in turn surrounded substantially by a unique one of said first source opening zones, each of said first source opening zones is surrounded by said gate network, and each of said inner gate zones is connected with said gate network by a gate bridge portion.

8. A semiconductor device as claimed in claim 7 wherein said semiconductor substrate comprises an upper layer of the second conductivity type in which said drain region is formed, and a lower layer of the second conductivity type defining a second major surface of said semiconductor substrate, and said low resistivity region is buried between said upper and lower layers.

9. A semiconductor device as claimed in claim 8 wherein said semiconductor substrate comprises a plurality of said base regions, a plurality of said source regions each of which is formed in a unique one of said base regions, and a plurality of said drain lead regions each of which is connected with said drain electrode through a unique one of said drain openings.

10. A semiconductor device as claimed in claim 9 wherein each of said drain lead regions is a region of material having a resistivity which is lower than a resistivity of said drain region, and said low resistivity region is a region of material having a resistivity which is lower than the resistivity of said drain region, wherein a width of said source opening zones is equal to or smaller than a smallest dimension of said drain openings, and wherein each of said drain openings is non-circular.

11. A semiconductor device as claimed in claim 8 wherein said gate area further comprises a plurality of outer gate zones each surrounding a unique one of said first source opening zones; said first insulating layer is further formed with a plurality of second source opening zones each surrounding a unique one of said outer gate zones; and each of said second source opening zones is surrounded by said intercellular gate network.

12. A semiconductor device as claimed in claim 8 wherein each of said first source opening zones comprises a series of regularly arranged source holes each of which is surrounded by said gate area.

13. A semiconductor device as claimed in claim 12 wherein each of said drain openings is square, and each of said source holes is square and smaller than said drain openings.

14. A semiconductor device as claimed in claim 13 wherein each of said first source opening zones comprises twelve of said source holes which are arranged in a square surrounding a unique one of said drain openings.

15. A semiconductor device as claimed in claim 14 wherein four corners of each of said drain openings are rounded, and four corners of each of said source holes are rounded.

16. A semiconductor device as claimed in claim 12 wherein each of said drain openings and said source holes is in a shape of a regular hexagon, and each of said drain openings is surrounded by six of said source holes, and wherein a line connecting a center of each of said drain openings and a center of one adjacent source hole intersects at right angles and bisects one side of the drain opening and one side of the adjacent source hole.

17. A semiconductor device as claimed in claim 8 wherein each of said first source opening zones comprises a stripe-shaped slot surrounded by said gate area.

18. A semiconductor device as claimed in claim 17 wherein each of said drain openings is surrounded by a unique one of said slots extending from a first slot end to a second slot end, and said bridge portion of said gate area is defined between said first and second slot ends.

19. A semiconductor device as claimed in claim 18 wherein each of said drain openings is square and has four equal sides, and each of said slots extends along a periphery of a square having four equal sides each of which is parallel to one side of the drain opening surrounded by the slot.

20. A semiconductor device as claimed in claim 19 wherein each of said slots has four right angled corners, and said first and second slot ends defines one bridge portion therebetween at a position equally distant from adjacent two of said four corners.

21. A semiconductor device as claimed in claim 17 wherein each of said first source opening zones comprises two of said stripe-shaped slots between which a unique one of said drain openings is located, and wherein each bridge portion of said gate area comprises a first bridge portion formed between first ends of the two stripe-shaped slots of one source opening zone and a second bridge portion formed between second ends of the two stripe-shaped slots.

22. A semiconductor device as claimed in claim 21 wherein each of said drain openings is square, each of said first source opening zones is square and uniform in width, and each of said inner gate zones is square and uniform in width.

23. A semiconductor device as claimed in claim 22 wherein said first and second bridge portions are formed, respectively, at two diagonally opposite corners of each of said inner source opening zones.

24. A semiconductor device as claimed in claim 22 wherein said first and second bridge portions are formed, respectively, at middle points in two opposite sides of each of said inner source opening zones.

25. A semiconductor device as claimed n claim 21 wherein each of said drain openings is square and located between the two stripe-shaped slots which are straight, and parallel to each other and to two parallel sides of the drain opening, and wherein said stripe-shaped slots are longer than said drain openings.

26. A semiconductor device as claimed in claim 17 wherein each of said stripe-shaped slots comprises a wide slot section through which said source electrode is connected to both of said source and base regions, and a narrow slot section through which said source electrode is connected only to one of said source regions and not connected to said base regions, and said narrow slot section is narrower than said wide slot section in each slot.

27. A semiconductor device as claimed in claim 26 wherein said narrow slot section of each of said stripe-shaped slots extends in a zigzag direction; wherein each of said stripe-shaped slots comprises a plurality of said narrow slot sections and a plurality of said wide slot sections which are arranged symmetrically around one of said drain regions.

28. A semiconductor device as claimed in claim 26 wherein said wide slot sections of a plurality of said first source opening zones are incorporated in a common source opening through which said source electrode is connected both of said source and base regions whereas said source electrode is not connected to said base regions through said stripe-shaped slots; and wherein each of said drain openings is square and said wide slot sections of three of said source opening zones are connected into the common source opening which is rectangular.

* * * * *